United States Patent [19]

Kalberer

[11] 4,422,932
[45] Dec. 27, 1983

[54] DEVICE FOR THE REMOVAL OF HEAT FROM WASTE WATER

[76] Inventor: Felix Kalberer, Bahnweg 34, CH-7320 Sargans, Switzerland

[21] Appl. No.: 347,609

[22] Filed: Feb. 10, 1982

[30] Foreign Application Priority Data

Feb. 16, 1981 [CH] Switzerland ............... 991/81

[51] Int. Cl.³ ............... B01D 25/00; F28F 19/00
[52] U.S. Cl. ............... 210/186; 210/411; 165/95; 165/119
[58] Field of Search ............... 210/184, 185, 186, 187, 210/175, 176, 315, 411, 333.01, 774, 791, 806; 165/95, 96, 119

[56] References Cited

U.S. PATENT DOCUMENTS

| 444,733 | 1/1891 | Stockheim | 210/315 |
|---|---|---|---|
| 1,822,021 | 9/1931 | Fuqua | 210/187 |
| 2,028,471 | 1/1936 | Parent et al. | 165/119 |
| 2,075,784 | 3/1937 | Strand | 165/119 |
| 2,210,256 | 8/1940 | Potocek | 210/184 |
| 2,777,581 | 1/1957 | Unthank | 210/187 |
| 3,289,839 | 12/1966 | Muller | 210/184 |
| 4,145,928 | 3/1979 | Jinks et al. | 210/411 |

FOREIGN PATENT DOCUMENTS

| 174356 | 1/1935 | Switzerland | 210/187 |
|---|---|---|---|
| 357240 | 9/1931 | United Kingdom | 210/187 |

*Primary Examiner*—Charles N. Hart
*Assistant Examiner*—John W. Czaja
*Attorney, Agent, or Firm*—Pollock, Vande Sande & Priddy

[57] ABSTRACT

Waste water is led into a container (1) through a inlet (4) at the top. A connection (20) between the inlet (4) and an outlet (21) having a check valve (22) comprises adjacent to the inlet (4) two inverted frusto-conical hollow bodies (24, 25) which are directly connected to each other. The connecting surface between the two hollow bodies (24, 25) is formed as a coarse screen (26). A round fine screen (30), which diverges downwardly, surrounds the hollow bodies (24, 25). Heat exchangers (31) are located in the space between the fine screen (30) and the wall (2) of the container (1). An outlet (5) terminates at the bottom of the container and connects with a riser (6) and via a bend (7) with the sewerage conduit (8). Through the coarse screen (26) the waste water reaches the container, and the heat can reach the heat exchangers (31) through the fine screen (30), so that practically uncontaminated water is present at the heat exchangers, and the need for cleansing is substantially diminished.

6 Claims, 1 Drawing Figure

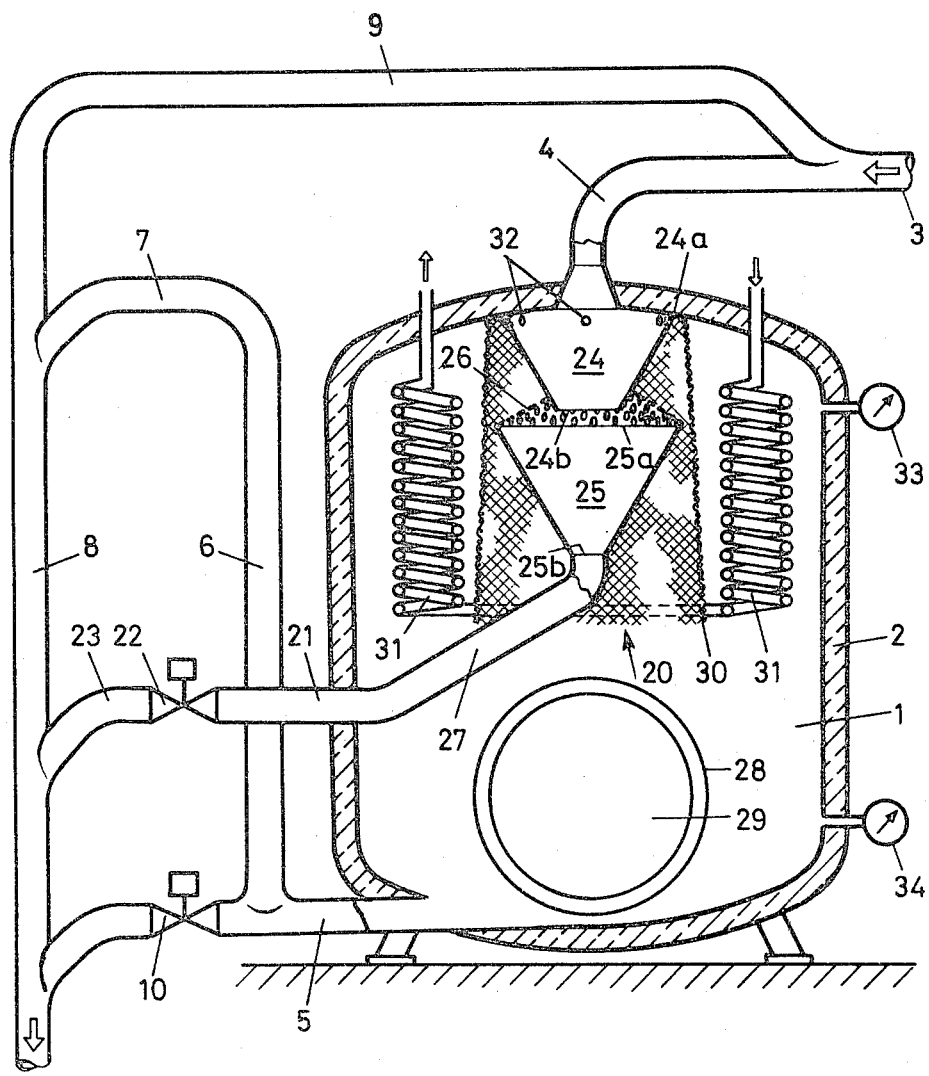

DEVICE FOR THE REMOVAL OF HEAT FROM WASTE WATER

The present invention relates to a device for removing heat from waste water by means of heat exchangers arranged in a container traversed by the waste water, which container is provided with an inlet conduit and at least one outlet conduit. The invention further relates to a method for operating such device.

The term waste water covers various types of waste water, which may contain almost every kind of containment. Waste water from sanitary installations, kitchens and canteens in workplaces largely coresponds to domestic waste water which results for the most part from rinsing, washing and cleaning operations, as well as the use of sanitary facilities. In central Europe, an average use of 150 liters of water per day and per person is assumed. In urban areas, the generated water water can be considered to approach the same order of magnitude. The level of contaminants is normally about 1 kg/m$^3$, urine and excrement constituting about one half of this amount. However, besides these contaminants, the waste water also contains a considerable amount of energy. It is known that waste water may have a mixture temperature of up to 50° C. and thus a heat content of about 210 J/kg. With a waste water flow of 150 liter this would result in a theoretical loss of energy of 31,500 J. However, the water temperature in the sewage should not fall below a minimum of 8° to 10° C., so that biological purification can occur. If the heat content of the water at 10° C. is set at 42 J/kg, 25,000 J of heat can be derived from the waste water of one person per day.

One difficulty arises from the relatively high contaminant content, which requires frequent cleansing of the heat exchangers. This maintenance work is time consuming and hence expensive.

It is therefore an object of the invention, with respect to a device of the above described type, to provide a solution by means of which frequent cleansing of the heat exchangers can be avoided, without resulting loss of the heat carried by the contaminants.

According to the invention, this is achieved by a connection of the inlet which is located at the top of the container with a first outlet located in the lower region, through a connecting means having a check valve and an overflow opening closed by a coarse screen, by further connection of a second outlet discharging at the floor of the container through a riser and a bend with the sewerage conduit into which the connecting means is also directed, and by providing a fine screen in the container between the connecting means and heat exchangers, surrounding the connecting means at least in the region of the overflow opening.

The method according to the invention is characterized in that, when the check valve is closed, the waste water is conducted through the inlet into the connecting means, the container emptying automatically when the water level reaches the level of the bend, and in that, for the purpose of cleansing both screens, the check valve is opened when the container is full.

An embodiment of the invention will now be described with reference to the drawing, which represents a sectional view of a device according to the invention.

In a container 1 with a heat-insulating wall 2, a waste water conduit 3 for domestic waste water is provided with an inlet 4 at the top. An outlet 5 discharges at the bottom of the container 1, and is connected to the waste water conduit 8, on the one hand via a riser 6 and a bend 7, and on the other hand directly through a check valve 10. A shunt conduit 9, which also leads to the waste water conduit 8, branches off from waste water conduit 3; this serves as an emergency overflow, as well as for ventilation.

Within container 1 is located a connecting means 20 for connecting inlet 4 with a further outlet 21 which is connected through a check valve 22 with a connector pipe 23 to the waste water conduit 8.

The connecting means 20 consists of two inverted frustoconical hollow bodies 24, 25, with a coarse screen 26 connecting the base line 25$a$ of the lower hollow body 25 with a location adjacent to the boundary line 24$b$ on the covering surface of the upper hollow body 24. The base line 24$a$ of the upper hollow body is attached to the wall 2, so that the inlet 4 enters directly into the upper hollow body 24. The boundary line 25$a$ on the covering surface side of the lower hollow body 25 is connected to the outlet 21 by means of an outlet pipe 27. The container 1 has a further opening, a manhole 28, which is closed in the usual manner by a screw-on cover 29.

The two hollow bodies 24, 25 are surrounded by a fine screen 30 which is also attached at the ceiling side of the wall 2 and diverges downwardly like an inverted conical frustrum. In the space between the fine screen 30 and the cylindrical portion of the wall 2 there are several separately arranged heat exchangers 31, which may, for example, be in the form of helical conduits for heat carrier means. These heat exchangers form the expanders for a conventional heat pump.

During operation, the domestic waste water is conducted into the container 1 through waste water conduit 3 and inlet 4. Since the shunt conduit 9 branches off in an upwardly inclined arc, waste water does not normally flow through it. When check valve 22 is closed, connecting means 20 fills up to coarse screen 26. The waste water, cleansed of coarse contaminants, thus reaches container 1. The air in the connecting means 20 can escape through vents 32 in upper hollow body 24 adjacent the ceiling wall of container 1.

The water level is measured by means of a level probe 33 in the upper region of the container 1, in order that the heat pump may be connected at a sufficient level. The level probe is arranged so as to provide assurance that the heat exchangers 31 have entered the waste water. By means of thermostats arranged in the lower region of container 1, the heat pump can be disconnected when the heavier cool water at the bottom of the container falls below a given temperature limit.

When the waste water in container 1 has reached at least the level which corresponds to the highest point of bend 7, an amount of water corresponding to that being collected flows into the sewerage conduit.

The container 1 is so arranged that nearly the entire heat content for one day can be discharged during the night hours.

While the fine screen 30 cleanses itself with water flowing back only each time the container is emptied, the check valve 22 is opened for the purpose of cleansing the coarse screen 26, so that here too the water flowing back rinses away the attached and free-floating contaminants.

The device achieves the result that relatively clean waste water flows about the heat exchangers 31, and contamination is therefore slight, so that cleansing is necessary only at relatively great intervals. Because of the downwardly diverging conical shape of the fine screen 30, the suspended particles separated by fine screen 30 can sink downwardly without ever coming into contact with the heat exchangers 31. The heat content can be withdrawn to the extent permitted in accordance with heat requirements.

I claim:

1. Device for removing heat from waste water by means of heat exchangers (31) arranged in a container (1) traversed by said waste water, comprising an inlet conduit (4) at the top of said container (1) connected by a connecting means (20) with a first outlet conduit (21) disposed in the lower portion of said container (1) and having a check valve (22), said connecting means (20) comprising two superposed hollow bodies (24, 25) in a stepwise arrangement with one another and a coarse screen (26) arranged therebetween for closing an overflow opening, a second outlet conduit (5) discharging at the floor of said container (1) and connected through a riser (6) and a bend (7) with a sewerage conduit (8) into which said first outlet conduit (21) is also directed, and a fine screen (30) surrounding said connecting means (20) at least in the region of said coarse screen (26) being disposed in said container (1) between said connecting means (20) and said heat exchangers (31).

2. Device according to claim 1, wherein said check valve (22) is located between said first outlet conduit (21) and a connecting pipe (23) discharging into said sewerage conduit (8).

3. Device according to claim 1, wherein said two hollow bodies (24, 25) have frusto-conical generated surfaces the base surfaces of which are directed toward said inlet conduit (4), said coarse screen (25) forming the base surface of the lower hollow body (25).

4. Device according to any one of claim 1 to 3, wherein the upper hollow body (24) is adjacent to the upper wall of said container (1), vents (32) being provided in the wall of said upper hollow body (24).

5. Device according to claim 2 or 3, wherein said fine screen (30) forms the generating surface of a vertically arranged truncated cone and is attached to the upper wall of said container (1) entirely about said inlet (4).

6. Device according to claim 1, wherein, when said check valve (22) is closed, said waste water is conducted through said inlet conduit (4) into said connecting means (20), the water level in said container (1) remaining constant when the water reaches the level of said bend (7), said check valve (22) in said first outlet conduit (21) being opened for the purpose of cleansing said coarse screen (26), in order to use at least part of the water in said container (1) as rinsing water for said coarse screen (26).

* * * * *